United States Patent
Stepniak (10) Patent No.: US 7,503,785 B2
(45) Date of Patent: Mar. 17, 2009

(54) SEPARABLE ELECTRICAL CONNECTOR COMPONENT HAVING A VOLTAGE OUTPUT BRANCH AND A DIRECT ACCESS POINT

(75) Inventor: Frank M. Stepniak, Cape May, NJ (US)

(73) Assignee: Thomas & Betts International, Inc., Wilmington, DE (US)

( * ) Notice: Subject to any disclaimer, the term of this patent is extended or adjusted under 35 U.S.C. 154(b) by 0 days.

(21) Appl. No.: 11/642,464

(22) Filed: Dec. 20, 2006

(65) Prior Publication Data

US 2007/0141882 A1 Jun. 21, 2007

Related U.S. Application Data

(60) Provisional application No. 60/752,644, filed on Dec. 21, 2005.

(51) Int. Cl.
*H10R 13/53* (2006.01)
(52) U.S. Cl. ........................................ 439/187; 439/921
(58) Field of Classification Search ................. 439/187, 439/183, 184, 185, 921, 205, 206
See application file for complete search history.

(56) References Cited

U.S. PATENT DOCUMENTS

| | | | | |
|---|---|---|---|---|
| 3,915,534 A * | 10/1975 | Yonkers | ........................ | 439/95 |
| 3,980,374 A | 9/1976 | Fallot | | |
| 4,161,012 A * | 7/1979 | Cunningham | ............... | 361/128 |
| 4,175,815 A | 11/1979 | Andersen et al. | | |
| 4,202,591 A | 5/1980 | Borgstrom | | |
| 4,799,895 A | 1/1989 | Borgstrom | | |
| 5,114,357 A * | 5/1992 | Luzzi | ........................ | 439/183 |
| 5,421,750 A * | 6/1995 | Crotty | ........................ | 439/801 |

FOREIGN PATENT DOCUMENTS

| | | |
|---|---|---|
| DE | 35 08 329 A1 | 9/1986 |
| DE | 94 04 393 | 5/1994 |
| EP | 0 087 267 A1 | 8/1983 |
| EP | 0 147 979 A1 | 7/1985 |
| GB | 2 188 496 A | 9/1987 |

OTHER PUBLICATIONS

U.S. Appl. No. 11/256,915, filed Oct. 24, 2005, Stepniak, et al.

* cited by examiner

*Primary Examiner*—Neil Abrams
*Assistant Examiner*—Phuong Nguyen
(74) *Attorney, Agent, or Firm*—Hoffman & Baron, LLP (57) ABSTRACT

A separable electrical connector component generally including an insulating housing, a current carrying element disposed within the insulative housing and a voltage control device disposed within the housing. The housing has a mid-section, a first insertion end extending from the mid-section in a first direction, a second insertion end extending from the mid-section in a second direction opposite the first direction and a third section extending outwardly from the mid-section between the first and second insertion ends. The current carrying member extends through the first insertion end, the mid-section and the second insertion end. The voltage control device is disposed within the third section of the housing and is in electrical communication with the current carrying element.

19 Claims, 5 Drawing Sheets

SEPARABLE ELECTRICAL CONNECTOR COMPONENT HAVING A VOLTAGE OUTPUT BRANCH AND A DIRECT ACCESS POINT

CROSS-REFERENCE TO RELATED APPLICATIONS

This application claims the benefit of U.S. Provisional Application No. 60/752,644, filed on Dec. 21, 2005.

FIELD OF THE INVENTION

The present invention relates to electrical cable connectors, and more particularly to an electrical connector component which provides for ancillary access, such as for voltage arresting and indirect voltage sensing, while maintaining a user interface for direct voltage testing or grounding and which has standard coupling or interface structure that permits separable connection of the component to existing field installed electrical cable connectors.

BACKGROUND OF THE INVENTION

Connections in medium-voltage underground power distribution systems, such as between cables and transformers, are generally accomplished with specially designed separable male and female electrical connectors, such as loadbreak connectors and deadbreak connectors. Such cable connectors, used in conjunction with 15, 25 and 35 kV systems, generally include a power cable elbow connector and a bushing insert. The elbow connector has one end adapted for receiving a power cable and another end adapted for receiving an insertion end of the bushing insert. The opposite end of the bushing insert, which extends outward from the elbow connector, may in turn be received in a bushing well of a transformer, for example.

Such elbow connectors typically comprise a conductor surrounded by a semiconducting layer and an insulating layer, all encased in a semiconductive outer shield. The end of the elbow adapted for receiving the bushing insert generally includes a conically tapered inner surface, which mates with a conically tapered outer surface formed on the insertion end of the bushing insert. When connected with a bushing insert, the conductor encased in the elbow makes mechanical and electrical contact with a conductor encased in the bushing insert. The elbow may further include a cuff at its bushing receiving end for providing an interference fit with a molded flange on the bushing insert. This interference fit between the elbow cuff and the bushing insert provides a moisture and dust seal therebetween.

Power distribution service personnel, whose function is to monitor and control such underground power distribution systems, often need to access the cables and connectors to facilitate servicing and repairs. One of the first steps required in servicing underground cable systems is to confirm that the circuit is deenergized. This is done by directly accessing a conductor within a connector and testing the voltage with a direct test probe. The conductor is then grounded at both ends to prevent injury should the cable system become accidentally energized. Finally, the cables are removed from the switch or transformer bushings to achieve a visible break between the cables and their respective bushings.

To accomplish the above voltage testing and grounding procedures, a direct operating interface is provided in the connector system to enable direct access to the conductor. Such interface is typically in the form of a loadbreak reducing tap plug having one end inserted in an elbow T-connector and having an open opposite end providing a direct access point to a cable attached to the T-connector, as shown and described in U.S. Pat. No. 4,799,895. When the cable system is energized, the open end of the tap plug is covered with an insulating cap. When the open end is uncovered, a direct test probe can be inserted therein to test the system voltage and a grounding elbow connector can be subsequently coupled thereto to ground the system.

It is also often desirable to perform ancillary functions on the cable system without having to deenergize the system. Such functions include active voltage sensing for circuit control and voltage surge arresting for lightening protection. Conventional devices for performing such functions typically consist of a separable connector component which is insertable into an access point of an existing connector. For example, existing voltage sensing devices, such as the Elastimold K650BIP device, use a resistor or capacitor divider network encapsulated in a basic insulation plug. As such, these conventional devices "dead-end" or terminate the access point preventing direct access to the conductor without separation of the connector.

Accordingly, it would be desirable to provide a single connector component, which permits both ancillary access to the cable system, as well as direct user access for tapping, direct voltage testing, grounding and the like.

SUMMARY OF THE INVENTION

The present invention is a separable electrical connector component generally including an insulating housing and a current carrying element disposed within the insulative housing. The housing has a mid-section, a first insertion end extending from the mid-section in a first direction, a second insertion end extending from the mid-section in a second direction opposite the first direction and a third section extending outwardly from the mid-section between the first and second insertion ends. The current carrying member extends through the first insertion end, the mid-section and the second insertion end. The third section is formed with a well for receiving a voltage control device. The voltage control device is disposed within the third section of the housing and is in electrical communication with the current carrying element.

In a preferred embodiment, the mid-section is a radially enlarged portion of the housing and the first and second insertion ends are conically tapered portions of the housing extending away from the mid-section and adapted for interference fit insertion in respective mating connectors. The current carrying element preferably includes a first section and a tubular second section. The first section extends in the first insertion end and terminates in a threaded end. The second section extends in the second insertion end and has a central bore for receiving a conductive probe.

The connector component may take the form of a voltage testing device, wherein the voltage control device is a capacitive element disposed in the third section. The capacitive element is in electrical communication with the current carrying element for capacitively detecting a voltage on the current carrying element.

In another embodiment, the connector component may take the form of a voltage arresting device, wherein the voltage control device is a voltage surge arrestor disposed in the third section. The voltage surge arrestor is in electrical communication with the current carrying element for arresting a voltage surge in the current carrying element.

A preferred form of the electrical connector component, as well as other embodiments, objects, features and advantages of this invention, will be apparent from the following detailed description of illustrative embodiments thereof, which is to be read in conjunction with the accompanying drawings.

DETAILED DESCRIPTION OF ILLUSTRATIVE EMBODIMENTS

Figure 1:
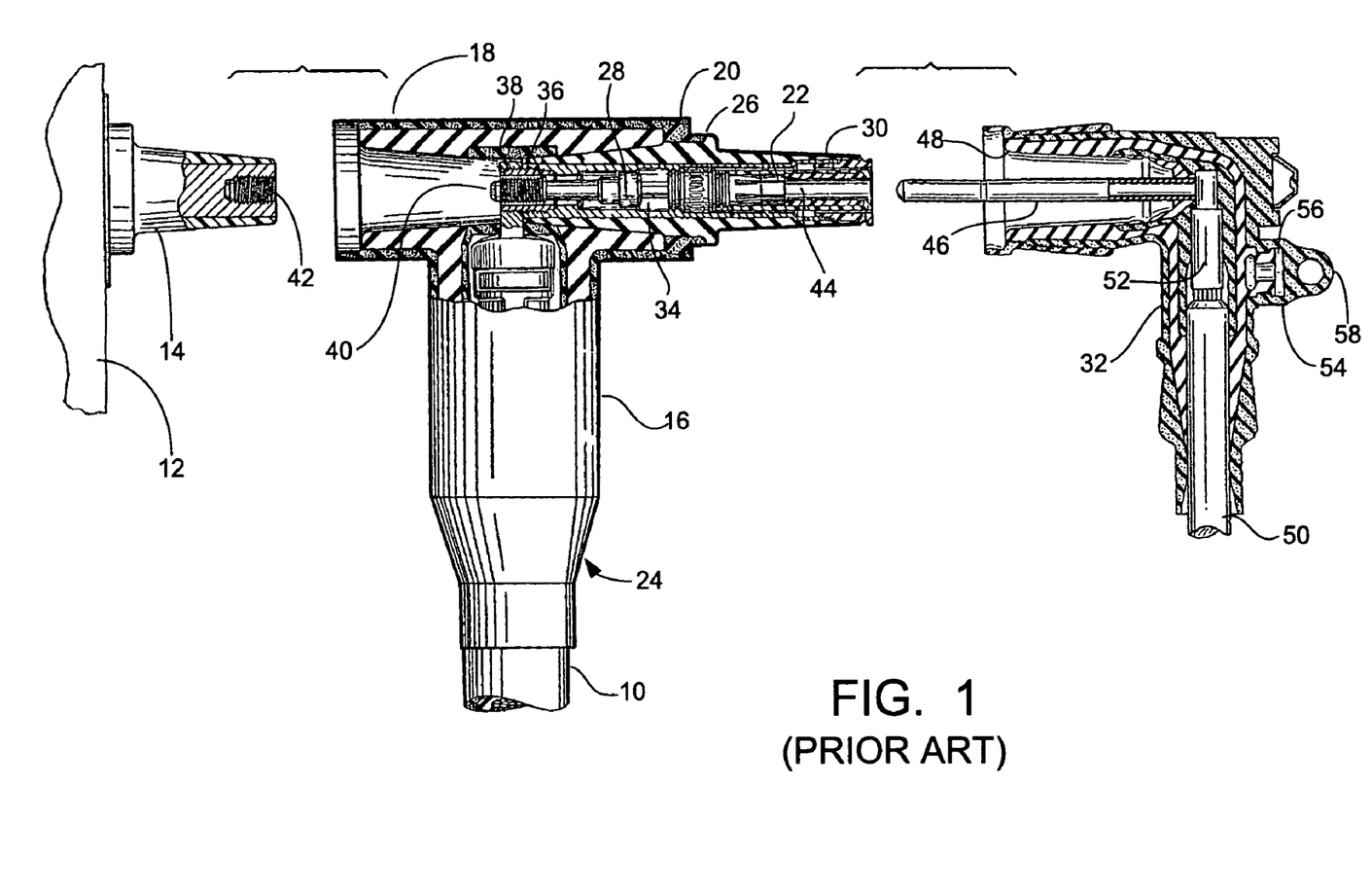
FIG. 1 is an exploded, partial cross-sectional view of a conventional power distribution cable connection to a piece of equipment showing an apparatus bushing, an elbow T-connector, a loadbreak reducing tap plug and a grounding elbow connector of the prior art.

Referring first to FIG. 1, a conventional prior art connection between a medium-voltage power distribution cable 10 and a power distribution apparatus 12, such as a transformer, is shown. An apparatus bushing or terminal 14 is provided on a face of the apparatus 12 for connection with the cable 10 via an elbow T-connector 16.

The power cable elbow T-connector 16 includes a first end 18 adapted for receiving the apparatus bushing 14, a second end 20 adapted for receiving a bushing tap plug 22 opposite the first end and a third end 24 adapted for receiving the power cable 10 at the bottom of the T-connector. The opposite first and second ends 18 and 20 include a flange or elbow cuff surrounding the open receiving end thereof for sealing against a respective mating bushing 14, 22.

The loadbreak reducing tap plug 22 seated in the second end 20 of the T-connector 16 provides an electrical connection between the power cable 10 and the apparatus bushing 14, while at the same time provides a direct access point to the cable. The loadbreak reducing tap plug 22, also termed an interface bushing or bushing insert, includes a mid-section 26 having a larger dimension than the remainder of the tap plug. Extending in one direction from the mid-section 26 is a conically tapered first section 28 which is inserted into the power cable elbow T-connector 16. Extending in the opposite direction from the mid-section 26 is a conically tapered second section 30 which is adapted to be inserted into an elbow connector 32, or a grounding elbow (not shown) upon disconnection and grounding of the cable 10. An insulating cap (not shown) covers the second section 30 of the tap plug 22 during normal operating conditions.

As described in U.S. Pat. Nos. 4,202,591 and 4,799,895, the specifications of which are incorporated herein by reference, the loadbreak reducing tap plug 22 further includes a current carrying member 34 for providing electrical connection between the cable 10 and the apparatus bushing 14. The current carrying member 34 includes a first section 36 extending within the first conical section 28 of the tap plug 22, which mechanically and electrically engages a terminal portion 38 of the cable 10. The first section 36 of the current carrying member 34 terminates at a threaded end 40, which is adapted to be threaded into a mating threaded hole 42 of the apparatus bushing 14. The conically tapered first end section 28 of the tap plug 22 having the threaded end first section 36 of the current carrying member 34 is known in the art as a 600 A deadbreak interface.

The current carrying member 34 of the tap plug 22 further includes a second section 44, extending within the second conical section 30 of the tap plug 22, adapted to provide a direct access point to the cable conductor 10. The second section 44 of the current carrying member 34 is tubular in structure and is adapted to receive a probe 46 of the elbow connector 32, a probe of a grounding elbow (not shown), or a direct voltage test probe (not shown). The conically tapered second end section 30 of the tap plug 22 having the tubular second section 44 of the current carrying member 34 is known in the art as a 200 A loadbreak interface.

The elbow connector 32 shown in FIG. 1 may be used to tap a 200 A current from the T-connector 10. However, as mentioned above, a grounding elbow (not shown) may be connected to the 200 A loadbreak interface of the tap plug 22 for disconnection and grounding purposes.

The probe 46 of the elbow connector 32 is positioned within a central opening of a bushing receiving end 48 of the elbow. The probe 46 is in electrical communication with a tap cable 50 via a connection element 52. The elbow connector 32 may include an ancillary access point 54 for voltage sensing, surge arresting and the like. FIG. 1 shows a conductive member 56 provided in the insulative housing of the elbow connector 32, which forms a capacitive coupling with the connection element 52 for voltage testing. Access to the conductive member 56 is achieved by removing an insulating cap 58 of the elbow connector 32.

Figure 2:
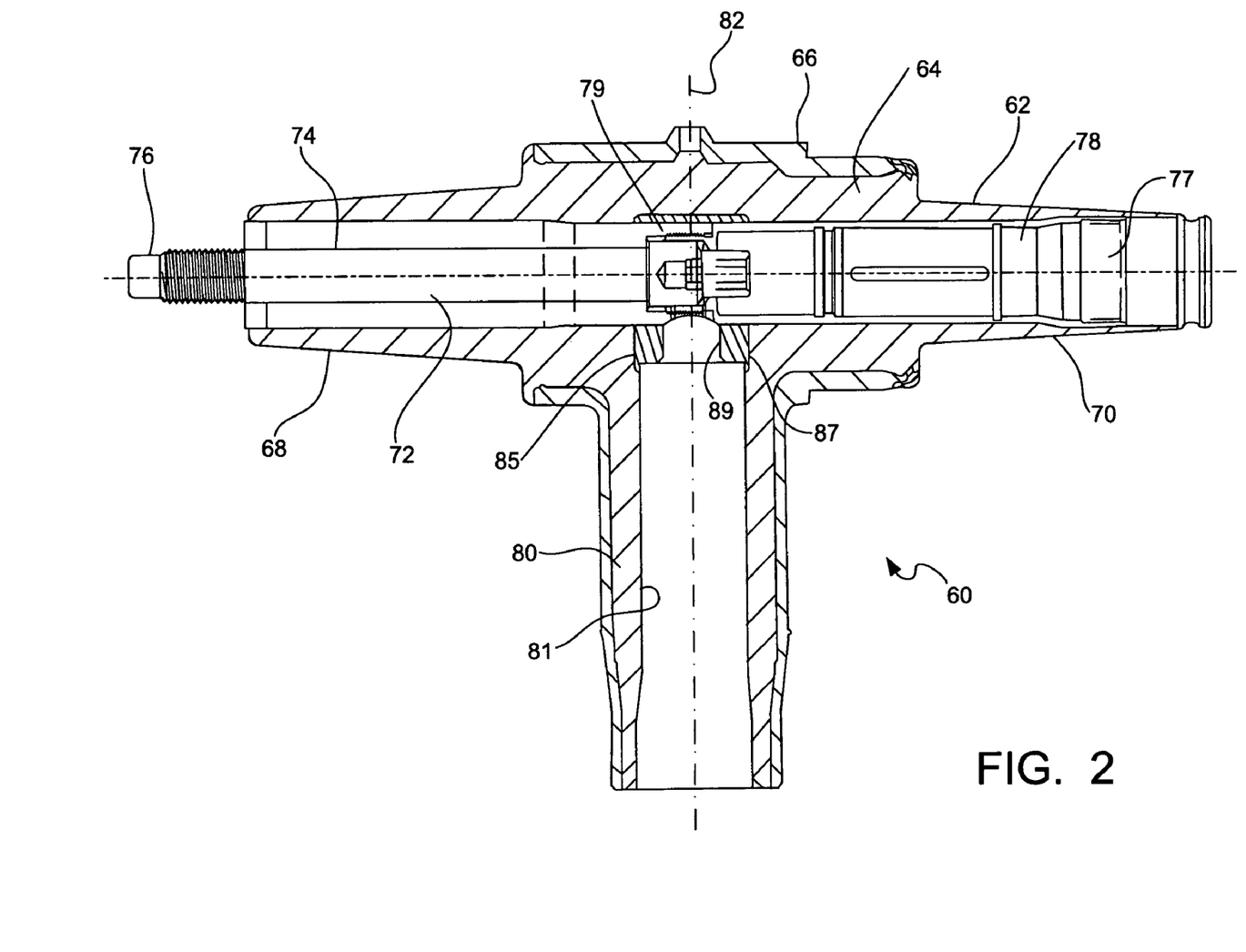
FIG. 2 is a cross-sectional view of the separable electrical connector component formed in accordance with the present invention.
Figure 3:
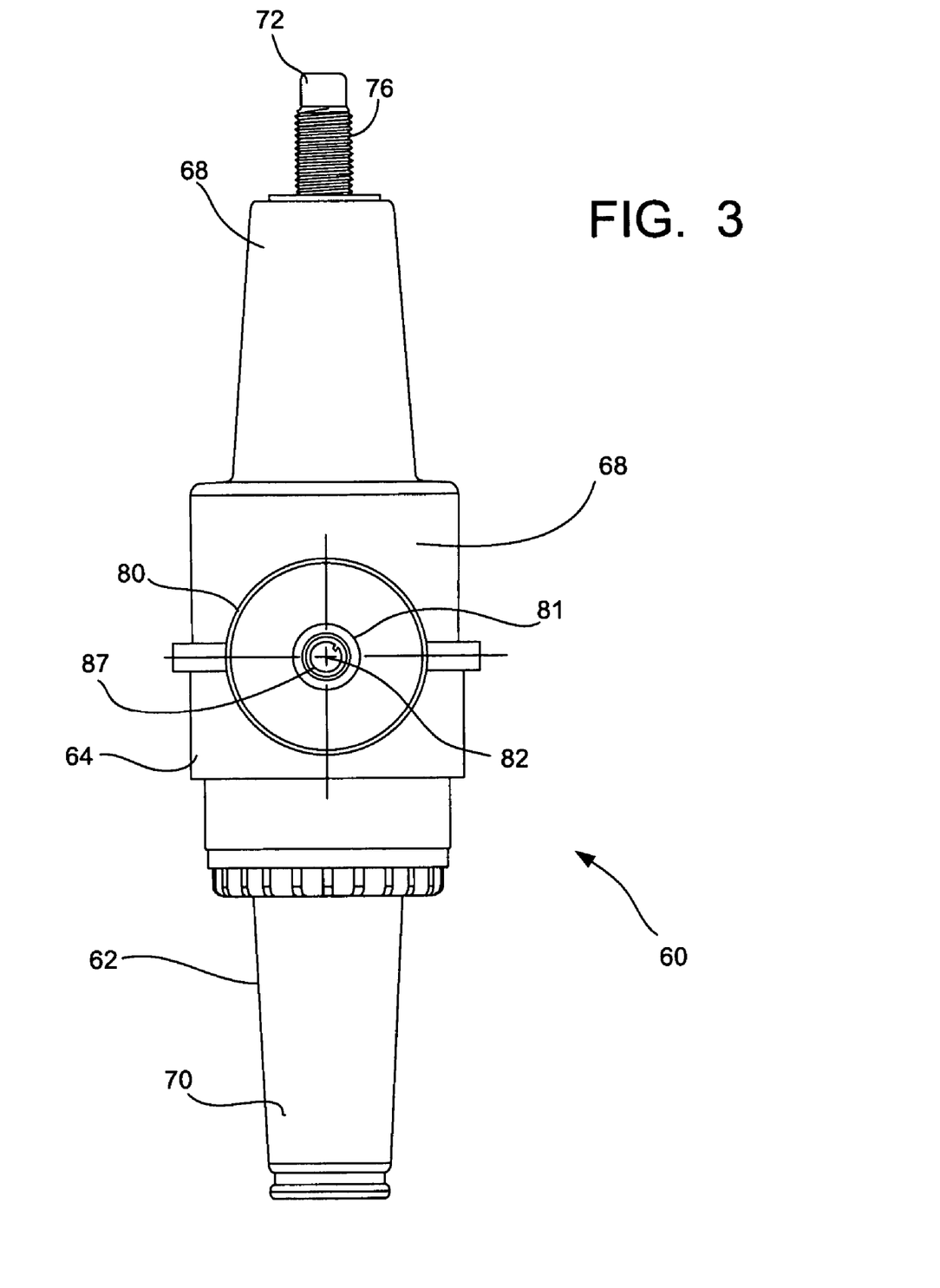
FIG. 3 is a side view of the separable electrical connector component formed in accordance with the present invention.

Turning now to FIGS. 2 and 3, the present invention is a separable connector component, which eliminates the need to attach an additional connector component to perform such ancillary tasks as active voltage sensing and surge arresting, while maintaining a direct access point to the power cable 10. In particular, in the preferred embodiment, the present invention takes the form of a modified loadbreak reducing tap plug 60, which takes the place of a conventional tap plug 22, as shown in FIG. 1, so as to provide a safe access point into the power line without any retrofitting.

Thus, the connector component 60 of the present invention is made generally similar in size and shape to a conventional loadbreak reducing tap plug 22, as shown in FIG. 1, and is provided with standard interfaces making it adapted to be connected in the field to an existing elbow T-connector at one end and a conventional elbow connector, grounding elbow, insulating cap or test cap at its opposite end. Specifically, the connector component 60 includes a molded insulative housing 62 having an enlarged mid-section 64 enclosed within a conductive shield 66. The connector component 60 also has a conically tapered first section 68, which is adapted to be inserted into a conventional power cable elbow T-connector 16. Extending in the opposite direction from the mid-section 64 is a conically tapered second section 70, which is adapted to be inserted into a conventional elbow connector 32 or grounding elbow upon disconnection and grounding of the cable 10. Like a conventional loadbreak reducing tap plug, the conical first and second sections 68, 70 of the connector component 60 of the present invention are sized and shaped to be interference-fit within their respective mating connectors.

The connector component 60 further includes a current carrying member or bus bar 72 centrally disposed within the first section 68, mid-section 64 and second section 70. Again like a conventional loadbreak reducing tap plug 22, the current carrying member 72 includes a first section 74 extending within the first conical section 68 of the connector component 60, which mechanically and electrically engages a terminal portion 38 of the cable 10. The first section 74 of the current carrying member 72 terminates at a threaded end 76, which is adapted to be threaded into a mating treaded hole 42 of a conventional apparatus bushing 14.

The current carrying member 72 of the connector component 60 further includes a second section 78 adapted to provide a direct access point to the cable conductor 10. Again like a conventional loadbreak reducing tap plug 22, the second section 78 of the current carrying member 72 is tubular in structure to provide a typical pin and socket engagement of a 200 A interface. Specifically, the second section 78 includes a central bore 77 formed therein, which is adapted to alternately receive, for example, a direct voltage test probe and a probe 46 of a conventional elbow connector 32. The first and second sections 74 and 78 are joined together in a conventional fashion so that mechanical and electrical connection is provided at a junction 79 therebetween.

The connector component 60 of the present invention, as thus far described, is similar to a conventional loadbreak reducing tap plug 22. However, the connector component 60 of the present invention further includes a third end section 80, termed a voltage output branch, extending outwardly from the mid-section 64 between the first and second sections 68 and 70. In particular, the insulative housing 62 forming the connector component 60 is generally T-shaped having the first and second sections 68 and 70 extending from the mid-section 64 in opposite directions and the third section 80 extending from the mid-section perpendicular to the first and second sections to form the bottom leg of the T-shaped housing. Thus, in general terms, the connector component 60 of the present invention consists of a bus linking a 600 A deadbreak interface to a 200 A loadbreak interface and having a third interface for providing electrical communication with the bus.

The third section 80 is preferably disposed centrally along the mid-section 64 of the housing 62. Also, as will be described in further detail below, the center line 82 of the third section 80 preferably intersects the junction 79 between the first and second sections 74, 78 of the current carrying member 72. Moreover, the mid-section 64 and the entire third section 80 are preferably enclosed within the conductive shield 66.

The third section 80 is formed with a voltage control device well 81, which, as will be described in further detail below, is adapted to interchangeably receive a voltage control device 83. The well 81 is preferably a bore or recess formed in the insulative housing 62 coaxially with the center line 82 of the third section and has a diameter and depth sufficient to receive a voltage control device 83, as described further below.

In the preferred embodiment, an electrically conductive fitting 87 is fixed in the bottom 85 of the well 81. The well fitting 87 can take various forms. The fitting 87 shown in the drawings is an annular fitting radially surrounding the current carrying member 72 at the junction 79 of the first and second sections 74 and 78. The well fitting 87 is in electrical contact with the current carrying member 72 and further includes a socket 89 adapted to receive an electrical end terminal of a voltage control device. The socket 89 is preferably internally threaded for cooperative mechanical and electrical engagement with the voltage control device terminal.

Figure 4:
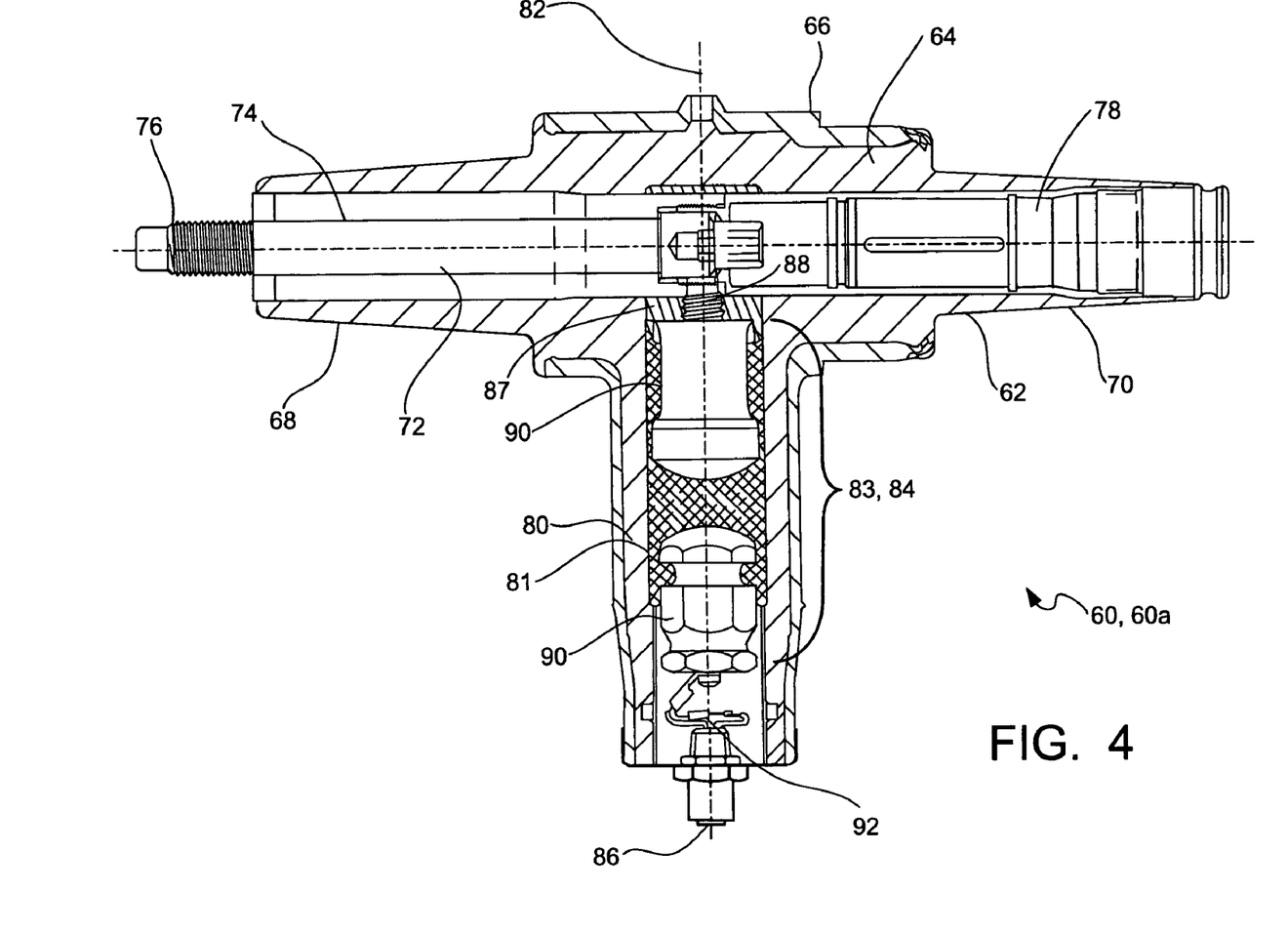
FIG. 4 is a cross-sectional view of the separable electrical connector component formed in accordance with the present invention in the form of a voltage sensing device.
Figure 5:
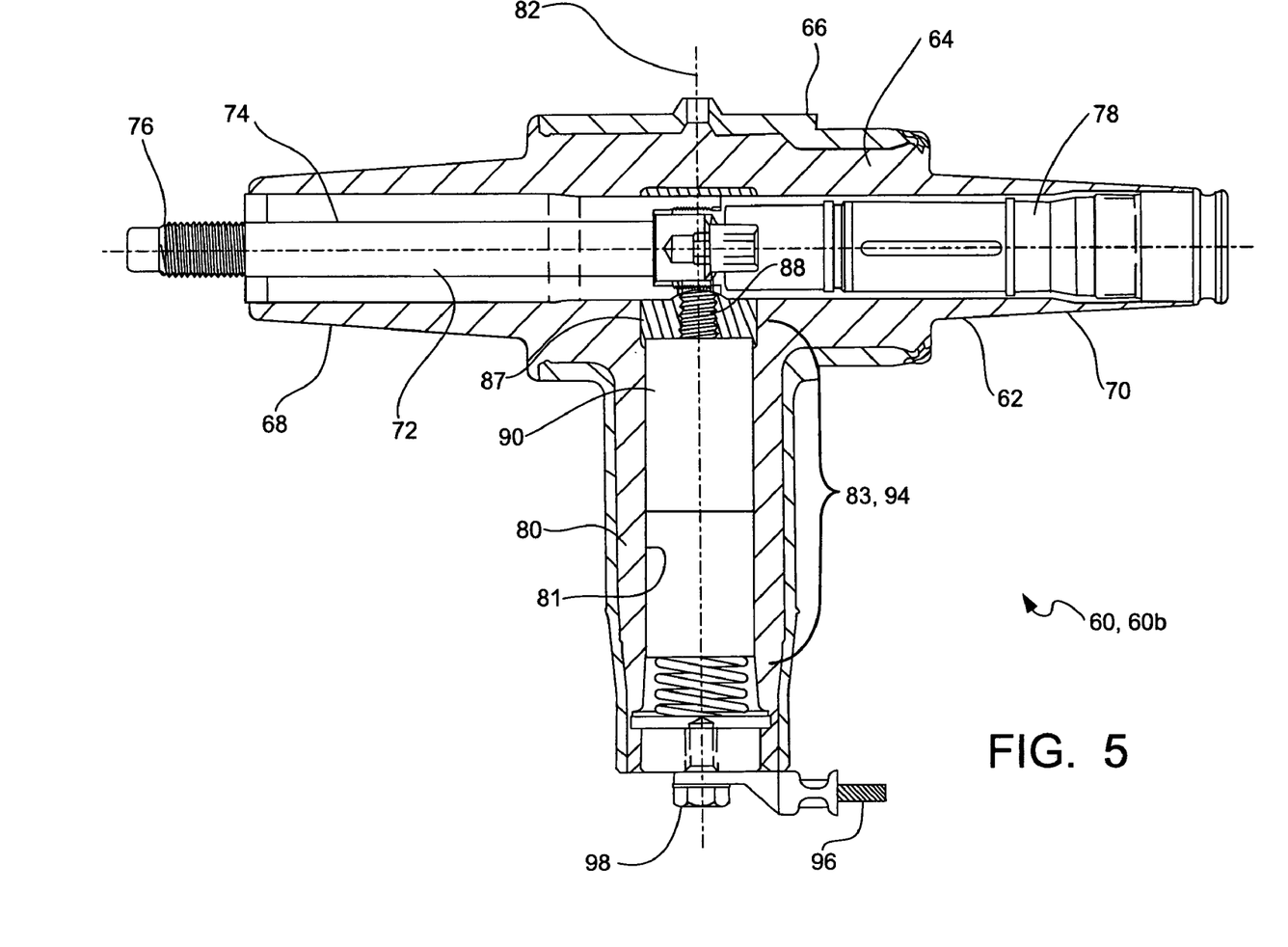
FIG. 5 is a cross-sectional view of the separable electrical connector component formed in accordance with the present invention in the form of a voltage arresting device.

Referring now to FIGS. 4 and 5, the third section 80 of the connector component 60 according to the present invention, with the well 81 and conductive fitting 87 provided therein, provides additional functionality to the connector not available with conventional loadbreak reducing tap plugs. In particular, the third section 80 of the connector component 60 is adapted to receive a voltage control device 83 disposed therein to provide additional functionality to the connector. For example, the connector component 60a shown in FIG. 4 is designed as a voltage sensing device. In this regard, the voltage control device 83 provided in the well 81 is a capacitive element 84 encapsulated in the third section 80 of the connector housing 62.

The capacitive element 84 can be provided in modular form and pressed into the well 81 of the third section 80 after molding of the housing 62. In this manner, the capacitive element 84 can be subsequently interchanged with other voltage control devices 83. Alternatively, the capacitive element 84 can be molded within the well 81 of the third section 80 during molding of the insulative housing 62. In this manner, the capacitive element 84 is integrally molded with the housing 62.

In both embodiments, the capacitive element 84 is on one side in electrical communication with the current carrying member 72 via the conductive fitting 87 and is provided on its opposite side with a voltage monitoring output connector 86. As described above, mechanical and electrical connection between the capacitive element 84 and the conductive fitting 87 can be achieved, for example, with a threaded terminal 88 provided at the end of the capacitive element. Alternatively, the terminal 88 of the device can be in direct electrical contact with the current carrying member 72 without use of the conductive fitting 87.

The voltage monitoring output connector 86, on the opposite side, is in turn adapted to be connected with a voltage sensing device to monitor voltage in the system for circuit control. The output connection 86 of the sensing device can be a low voltage connector adapted to engage a mating connector of a voltage sensing device, or the output connection may simply be in the form of loose wires adapted for hard wire connection with a voltage sensing device.

The capacitive element 84 can be in the form of a replaceable cartridge or plug-in type assembly, which is inserted in the well 81 of the housing third section 80. Various ceramic capacitors of this type having a suitable capacitance, impedance and resistance to permit accurate voltage monitoring are commercially available. Such devices may also include active as well as passive circuit elements for signal conditioning, such as amplification or noise suppression, and may also include additional contacts to control other devices at preset voltage levels as well. As mentioned above, the capacitive element 84 may alternately take the form of two electrodes 90 molded in close proximity directly within the third section 80 of the housing 62 to form a capacitive coupling therebetween.

The output of the capacitive element 84 is preferably connected to an impedance element 92 (internal or external) to establish a voltage divider network. The impedance element 92 can be a passive device, such as a resistor or a capacitor, or the impedance element can take the form of an active device, such as an integrated circuit or amplifier, for output signal conditioning. In either case, the impedance element is preferably set to calibrate the desired output/input ratio.

As described above, conventional prior art devices that perform this voltage sensing function are typically provided on a 600 A elbow T-connector, as opposed to a 200 A loadbreak reducing tap plug. Voltage sensing can also be achieved by connecting a conventional prior art 200 A elbow connector 32 to an installed 200 A loadbreak reducing tap plug. However, the connector component 60a of the present invention incorporates the loadbreak tap to ease utility system operation and reduce outage time.

As a result, the electrical connector component 60a, in the form of a voltage sensing device provides an analog voltage output proportional to the power system voltage. Whereas other voltage sensing devices dead-end their mated connector, preventing access to the conductor system, this device provides a loadbreak operating interface allowing a tap, direct voltage test or ground point.

Turning to FIG. 5, another electrical connector component 60b, in the form of a voltage surge arresting device is shown. The connector component 60b shown in FIG. 5 is identical in size and shape to the component 60a shown in FIG. 4. Thus, the components are interchangeable. However, here the voltage control device 83 encapsulated in the third section 80 is a voltage surge arrestor 94.

Specifically, the connector component 60b of FIG. 5 again includes a molded insulative housing 62 having an enlarged mid-section 64, a conically tapered first section 68, which is adapted to be inserted into a conventional power cable elbow T-connector, and a conically tapered second section 70 opposite the first section, which is adapted to be inserted into a conventional elbow connector 32. The connector component 60b further includes a current carrying member 72 centrally disposed within the first section 68, mid-section 64 and second section 70.

The current carrying member 72 includes a first section 74 extending within the first conical section 68 of the connector component 60b and terminating at a threaded end 76, which mechanically and electrically engages a terminal portion 38 of the cable 10, as well as a mating treaded hole 42 of a conventional apparatus bushing 14. The second section 78 of the current carrying member 72 is tubular in structure to provide a typical pin and socket engagement adapted to receive a probe 46 of a conventional elbow connector 32.

Again, the connector component 60b of the present invention further includes a third end section 80, extending outwardly from the mid-section 64 between the first and second sections 68 and 70, and a well 81 formed in the third section. However, in this case, a voltage surge arrestor 94 is disposed within the well 81 of the third section 80 of the T-shaped housing 62. Electrical contact between the voltage surge arrestor 94 and the current carrying member 72 is again achieved via the conductive fitting 87 disposed at the bottom of the well and a threaded terminal 88 provided at the end of the surge arrestor 94.

The voltage surge arrestor 94 is preferably a zinc-oxide arrester block stack disposed between the bus 72 and ground. In this regard, a ground lead 96 is preferably attached to an output terminal 98 of the arrestor. The voltage class of the connector component 60b would dictate the arrester rating. In other words, the connector component 60b can accommodate a range of zinc-oxide block stack lengths for the various ratings. Voltage surge arrestors of this type are described in U.S. Pat. No. 4,161,012, the specification of which is incorporated herein by reference.

As a result, the connector component 60b shown in FIG. 5 provides a deadfront arrester to a medium voltage utility system with 600 A separable connectors without an intermediate device while preserving the requirement for direct test and grounding. As discussed above, voltage surge arresting is conventionally accomplished with a combination of a loadbreak reducing tap plug used with an elbow surge arrester to provide lightning protection on a 600 A system. This invention performs this function with a single integral unit. The advantages of this invention are: fewer components to perform the arresting function; maintaining lightning protection during test and grounding procedures and allowing a 200 A tap without removing the arrester.

The connector component 60 of the present invention can take various forms and be adapted for connection to connectors with various electrical ratings. In particular, it is readily apparent that various other voltage control devices 83 can be interchanged within the well 81 of the third section 80 of the housing 62. For example, once the component 60 is installed in the field, a voltage control device 83 fitted within the third section 80 of the housing can be removed and replaced with a different voltage control device, depending on the desired application.

Moreover, the described device 60 has a 600 A bushing interface (15 kV/25 kV or 35 kV) on one side and a 200 A loadbreak interface (15 kV, 25 kV or 35 kV) on the other for medium voltage connection. However, depending on the need of an individual application, either side can be fitted with a bushing, bushing well, elbow or bushing interface, loadbreak or deadbreak.

Although the illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A separable electrical adapter comprising:
   an insulative housing having a mid-section, a first insertion end extending from said mid-section in a first direction, a second insertion end extending from said mid-section in a second direction opposite said first direction and a third section extending outwardly from said mid-section between said first and second insertion ends, said third section having a well formed therein for receiving a voltage control device;
   a current carrying member disposed within said insulative housing and extending through said first insertion end, said mid-section and said second insertion end, said well being in communication with said current carrying member; and
   a voltage control device interchangeably received within said well of said housing third section and being in electrical communication with said current carrying member, said voltage control device comprising two electrodes and an impedance element for detecting a voltage on said current carrying member or a surge arrestor for arresting a voltage surge in said current carrying member.

2. A separable electrical adapter as defined in claim 1, wherein said mid-section is a radially enlarged portion of said housing and said first and second insertion ends are conically tapered portions of said housing extending away from said mid-section and are adapted for interference fit insertion in respective mating connectors.

3. A separable electrical adapter as defined in claim 1, wherein said current carrying member comprises a first section and a tubular section opposite said first section, said first section extending in said first insertion end and terminating in a threaded end, and said second section extending in said second insertion end and having a central bore for receiving a conductive probe.

4. A separable electrical adapter as defined in claim 1, further comprising a conductive fitting disposed at a bottom of said well, said fitting being in electrical communication with said current carrying member and said voltage control device.

5. A separable electrical adapter as defined in claim 4, wherein said fitting includes a socket for electrically and mechanically engaging a terminal of the voltage control device.

6. A separable electrical adapter as defined in claim 5, wherein said socket is internally threaded for engagement with an externally threaded terminal of the voltage control device.

7. A separable electrical adapter as defined in claim 1, wherein said voltage detection device comprises a capacitive element in electrical communication with said current carrying element for capacitively detecting a voltage on said current carrying member.

8. A separable electrical adapter as defined in claim 7, wherein said voltage detection device further comprises a terminal disposed at one end thereof and a voltage monitoring output connector disposed at an opposite end thereof, said voltage monitoring output connector being adapted to engage a mating connector of a voltage sensing device.

9. A separable electrical adapter as defined in claim 7, wherein said voltage detection device further comprises an impedance element for output signal conditioning.

10. A separable electrical adapter comprising:
an insulative housing having a mid-section, a first insertion end extending from said mid-section in a first direction, a second insertion end extending from said mid-section in a second direction opposite said first direction and a third section extending outwardly from said mid-section between said first and second insertion ends;
a current carrying member disposed within said insulative housing and extending through said first insertion end, said mid-section and said second insertion end; and
a voltage control device disposed within said third housing section and being in electrical communication with said current carrying member, said voltage control device comprising two electrodes and an impedance element for detecting a voltage on said current carrying member or a surge arrestor for arresting a voltage surge in said current carrying member.

11. A separable electrical adapter as defined in claim 10, wherein said voltage control device is integrally molded within said third section of said insulative housing.

12. A separable electrical adapter as defined in claim 10, wherein said mid-section is a radially enlarged portion of said housing and said first and second insertion ends are conically tapered portions of said housing extending away from said mid-section and are adapted for interference fit insertion in respective mating connectors.

13. A separable electrical adapter connector component as defined in claim 10, wherein said current carrying member comprises a first section and a tubular second section opposite said first section, said first section extending in said first insertion end and terminating in a threaded end and said second section extending in said second insertion end and having a central bore for receiving a conductive probe.

14. A separable electrical adapter as defined in claim 10, wherein said voltage detection device comprises a capacitive element integrally molded within said third section, said capacitive element being in electrical communication with said current carrying member for capacitively detecting a voltage on said current carrying member.

15. A separable electrical adapter as defined in claim 14, wherein said voltage detection device further comprises a terminal in electrical communication with said current carrying member and a voltage monitoring output connector disposed opposite said terminal, said voltage monitoring output connector being adapted to engage a mating connector of a voltage sensing device.

16. In combination:
a power distribution apparatus having a terminal;
an elbow T-connector having a first end for receiving said power distribution apparatus terminal, a second end opposite said first end and a third end extending outwardly from said elbow T-connector between said first and second ends;
a power cable connected to said third end of said elbow T-connector for delivering power to said power distribution apparatus;
a separable electrical adapter received in said second end of said elbow T-connector, said separable electrical adapter including:
an insulative housing having a mid-section, a first insertion end extending from said mid-section in a first direction and received in said second end of said elbow T-connector, a second insertion end extending from said mid-section in a second direction opposite said first direction and a third section extending outwardly from said mid-section between said first and second insertion ends, said third section having a well formed therein for receiving a voltage control device;
a current carrying member disposed within said insulative housing and extending through said first insertion end, said mid-section and said second insertion end for electrically connecting said power cable to said terminal, said well being in communication with said current carrying member; and
a voltage control device interchangeably received within said well of said housing third section and being in electrical communication with said current carrying member, said voltage control device comprising two electrodes and an impedance element for detecting a voltage on said current carrying member or a surge arrestor for arresting a voltage surge in said current carrying member; and
one of an elbow connector, a grounding elbow, an insulating cap or a test plug connected to said second insertion of said separable electrical connector.

17. A combination as set forth in claim 16, wherein said second end of said elbow T-connector comprises a conically tapered internal surface, and wherein said one of an elbow connector, a grounding elbow, an insulating cap or a test plug comprises a conically tapered internal surface, and wherein said mid-section of said separable electrical adapter housing is a radially enlarged portion of said housing and said first and second insertion ends are conically tapered portions of said housing extending away from said mid-section, said first insertion end being interference fit with said conically tapered internal surface of said elbow T-connector second end and said second insertion end being interference fit with said conically tapered internal surface of said one of an elbow connector, a grounding elbow, an insulating cap or a test plug.

18. A combination as defined in claim 16, wherein said voltage control device is a voltage detection device for detecting a voltage on said current carrying member.

19. A combination as defined in claim 16, wherein said voltage control device comprises a surge arrestor in electrical communication with said current carrying member for arresting a voltage surge in said current carrying member.

* * * * *